United States Patent [19]

Lenormand et al.

[11] Patent Number: 4,965,587
[45] Date of Patent: * Oct. 23, 1990

[54] ANTENNA WHICH IS ELECTRONICALLY RECONFIGURABLE IN TRANSMISSION

[75] Inventors: Régis Lenormand, Toulouse; Marcel Billand, Noé; Pierre Fraise, Frouzins; Jean-Claude Goupil, Plaisance du Touch; Gérard Raguenet, Labarthe sur Leze; Didier René, Toulouse, all of France

[73] Assignee: Societe Anonyme dite: Alcatel Espace, Courbevoie, France

[*] Notice: The portion of the term of this patent subsequent to Oct. 23, 2007 has been disclaimed.

[21] Appl. No.: 325,796

[22] Filed: Mar. 20, 1989

[30] Foreign Application Priority Data

Mar. 18, 1988 [FR] France .............................. 88 03547

[51] Int. Cl.$^5$ .............................................. G01S 7/03
[52] U.S. Cl. ...................................... 342/372; 342/373
[58] Field of Search ............... 342/352, 354, 368, 371, 342/372, 373, 374, 376, 377

[56] References Cited

U.S. PATENT DOCUMENTS

| 3,993,999 | 11/1976 | Hemmi et al. | 342/372 X |
|---|---|---|---|
| 4,477,781 | 10/1984 | Reuss, Jr. | |
| 4,799,065 | 1/1989 | Thompson | 342/372 X |
| 4,825,172 | 3/1989 | Thompson | 342/373 X |
| 4,827,268 | 5/1989 | Rosen | 342/368 |
| 4,864,311 | 9/1989 | Bennett et al. | 342/368 |

FOREIGN PATENT DOCUMENTS 2241886 5/1973 France.
2368836 10/1976 France.
2570883 9/1985 France.

OTHER PUBLICATIONS

RCA Review, vol. 46, No, 3, Sep. 3, 1985, pp. 375-392, Princeton, N.J., U.S.; S. H. Colodny et al., "Active Array Antenna Beam Shaping for Direct Broadcast Satellites and Other Applns", FIG. 1; pp. 376-378.
IEEE Introduct'l. Conf. on Communications 1985, Chicago, Ill., Jun. 23-26, 1985.

Primary Examiner—Thomas H. Tarcza
Assistant Examiner—Tod Swann
Attorney, Agent, or Firm—Sughrue, Mion, Zinn, Macpeak & Seas

[57] ABSTRACT

The present invention relates to an antenna which is electronically reconfigurable in transmission. The antenna comprises an array (11) of elementary sources, an energy-focusing reflector (10), with the array (11) being situated in the focal zone of the reflector, and control and feed electronics, the electronics comprising an amplifier stage (22) constituted by amplifiers (24) and including at least one generalized coupler disposed at the outputs of the amplifiers (24), and beam-forming circuits (20, 21) each corresponding to a transmitted beam, with the amplitude and relative phase of the signals leaving said circuits being controlled by respective adjustable phase shifters and adjustable attenuators. The invention is particularly applicable to space telecommunications.

4 Claims, 3 Drawing Sheets

ANTENNA WHICH IS ELECTRONICALLY RECONFIGURABLE IN TRANSMISSION

The invention relates to an antenna which is electronically reconfigurable in transmission.

BACKGROUND OF THE INVENTION

A work entitled "télécommunications spatiales" in the telecommunications scientific and technical collection published by Masson, 1982, and in particular vol. I thereof at pp. 92 to 94 and pp. 259 to 261, describes firstly the grouping together of a plurality of antennas which are fed simultaneously from a common transmitter with interposed power dividers and phase shifters, with the characteristics of said group of antennas depending both on the radiation pattern of each antenna and on the way in which power is distributed between them in amplitude and in phase. This property is made use of for obtaining a radiation pattern which cannot be obtained using a single radiating source. Further, if the characteristics of the power dividers and of the phase shifters are modified by electronic means, the radiation pattern can be changed quasi-instantaneously. The simplest way of grouping together radiating sources is to constitute an array in which all of the sources are identical and are offset relative to one another merely in translation. This can give rise, in particular, to arrays which are rectilinear or plane.

The above document also describes the use of antennas having reflectors for generating multiple beams, thereby obtaining a saving in weight and making it possible to provide large radiating areas by using deployable structures. In general, this type of antenna is used when it is desired to generate a plurality of narrow beams. In general, the reflector illuminating system is offset relative to the center of the reflector in order to avoid masking any of the radiating aperture. Any masking of this aperture gives rise to an increase in the level of secondary lobes, and this must be avoided at all costs in this type of application. The main reflector may be a paraboloid, for example. The multiple beams are obtained by placing a set of illuminating sources in the vicinity of the focus, with each source corresponding to one of the beams. Since the sources cannot be located exactly at the focus, illumination is not geometrically perfect and as a result phase aberrations arise which degrade the radiation performance somewhat. The following are observed: the radiation pattern is deformed; there is a loss of gain relative to the gain which could be obtained at the focus; and parasitic secondary lobes arise. The greater the curvature of the reflector and the greater the distance from the focus, the greater the resulting degradations. As a result, reflectors must be made as "flat" as possible, i.e. with a large ratio of focal length to aperture diameter. This gives rise to structures which are large in size, thereby raising problems of accuracy and mechanical strength. In addition, mutual parasitic coupling may arise between the various sources, thereby giving rise to additional secondary lobes.

Given that polarization diversity cannot be used (because of multi-path problems in the 1.6 GHz band (L band)), the only solution is that of frequency reutilization (in particular since bandwidth is rigorously limited for users of satellite telecommunications). The feasibility of such a system thus depends on the possibility of using an antenna with frequency reutilization. Another requirement, from the systems point of view, is that the antenna should be capable of adapting to changes in the location of the request for service. This means that the antenna used should have reconfigurable coverage.

The object of the invention is to satisfy this requirement.

SUMMARY OF THE INVENTION

To this end, the present invention provides an antenna which is electronically reconfigurable in transmission, the antenna comprising an array of elementary sources, feed and control electronics, and an energy-focusing reflector, with the array being situated in the focal zone of said reflector, said feed and control electronics comprising:

m beam-forming circuits which synthesize m beams;

an amplifier stage which receives the outputs from the beam-forming circuits as combined by means of combiners, said amplifier stage comprising amplifiers connected in parallel and followed by a generalized coupler; and a switching circuit which interconnects the outputs from the amplifier stage to the radiating elements of the array.

The solution proposed is of the electronically scanned type. It is constituted by an array which synthesizes the electromagnetic field in the focal zone of a reflector.

In addition to the advantages of a compact configuration and of ease of thermal monitoring, the simplicity of the adjustment in the amplitude and the phase of the signals applied to the results make it possible:

to change the beam direction (for reconfiguration) and to compensate for aberrations due to displacement of the reflector relative to the source; and to obtain antenna radiation patterns having small side lobes (frequency reutilization) and to be able to vary the shape of the arrays.

BRIEF DESCRIPTION OF THE DRAWINGS

An embodiment of the invention is described by way of example with reference to the accompanying drawings, in which.

DETAILED DESCRIPTION

Figure 1:
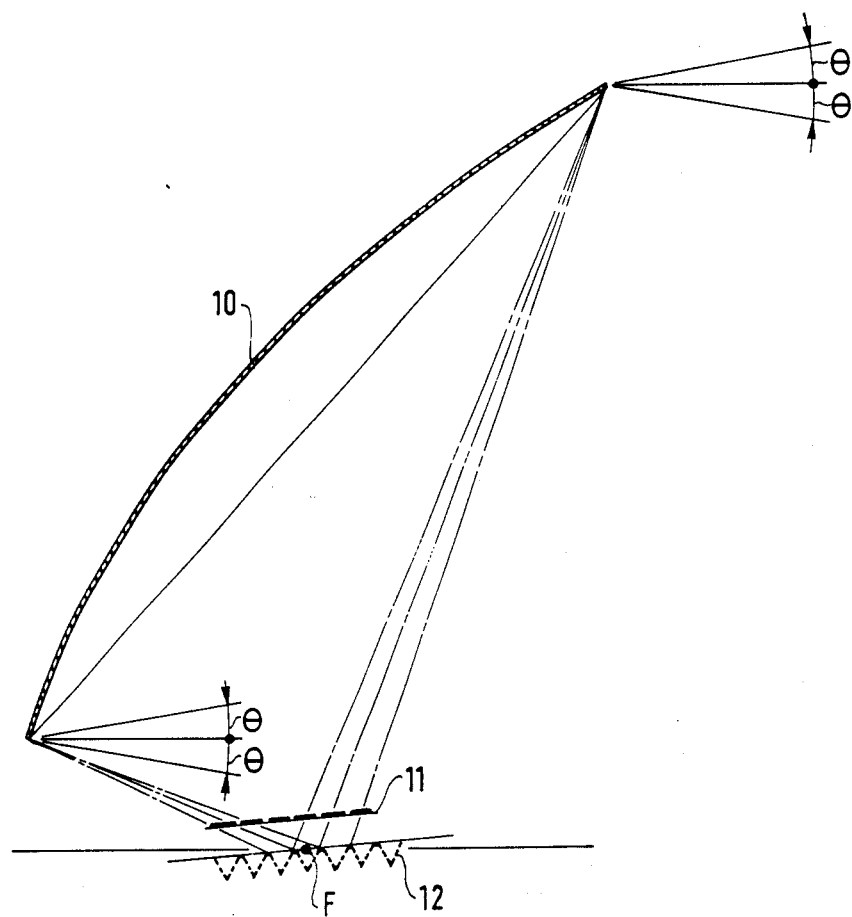
FIG. 1 is a diagrammatic illustration of a scanned antenna in accordance with the invention.

An antenna in accordance with the invention as shown in FIG. 1 comprises a parabolic reflector 10 which is fed excentrically by a plane array 11 of sources situated in the vicinity of the focus F of the reflector, with the array 12 representing the array of virtual sources that corresponds to the array 11.

Figure 2:
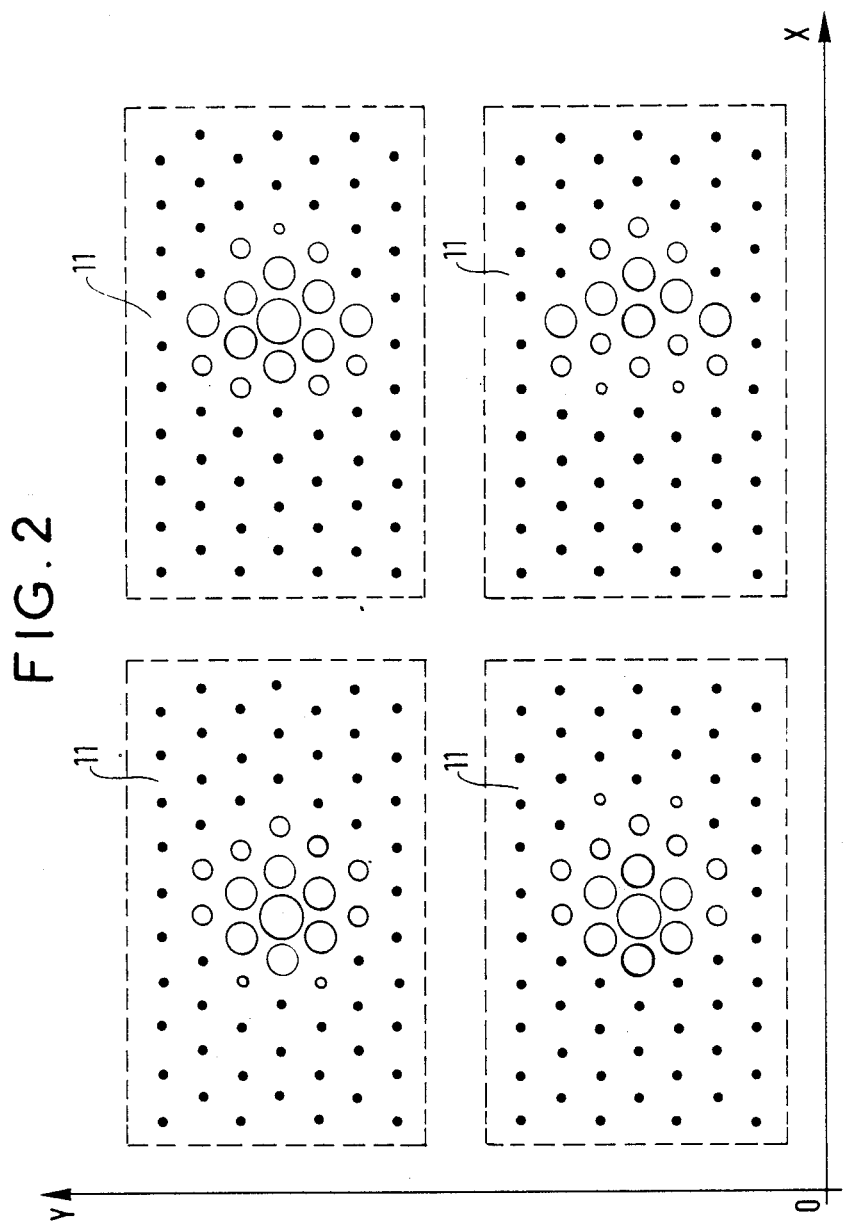
FIG. 2 illustrates operation of the antenna in accordance with the invention.

FIG. 2 shows an example of various different amplitude distributions for displacements along two directions OX and OY along the array 11 of sources.

The diameters of the disks shown in FIG. 2 represent the amplitudes of the signals received by the various array sources.

When the sensor has a fixed distribution law, the efficiency of the sensor in sensing these various energy distributions cannot be optimal. The same applies to phase distribution.

Thus, if a source is notionally displaced relative to the focus of the reflector, the radiation output of the antenna is degraded.

In an antenna of the invention, the amplitude and the phase of each elementary source is adjusted. This makes it possible to obtain optimum synthesis of each elementary source as though it were located at the focus F of the reflector.

Such operation makes it possible to design an antenna whose gain does not depend on its aiming direction, while nevertheless keeping the reflector 10 and the array 11 of elementary sources fixed.

It is difficult to sum beams of different phase and amplitude without giving rise to losses.

If summing is performed prior to amplification in order to obtain the beam(s) to be synthesized, the amplifiers will be loaded differently and as a result it is no longer possible to obtain:

linear amplification (since the dynamic range of the input signal is large); or constant gain (since the dynamic range of the input signal is large).

As a result, the electronic transmission system needs to be overdimensioned, thereby consuming excessive power.

The description below relates to two beams F1 and F2, but it is clear that the invention is equally applicable to n beams Fj.

In order to load the amplifiers uniformly, regardless of the positions of the beams F1 and F2, the invention proposes using at least one generalized coupler for getting as close as possible to optimum operating conditions, with each amplifier providing optimum efficiency while it is working at its own optimum operating point.

The invention makes it possible to optimize the effective load in terms of power consumption.

Figure 3:
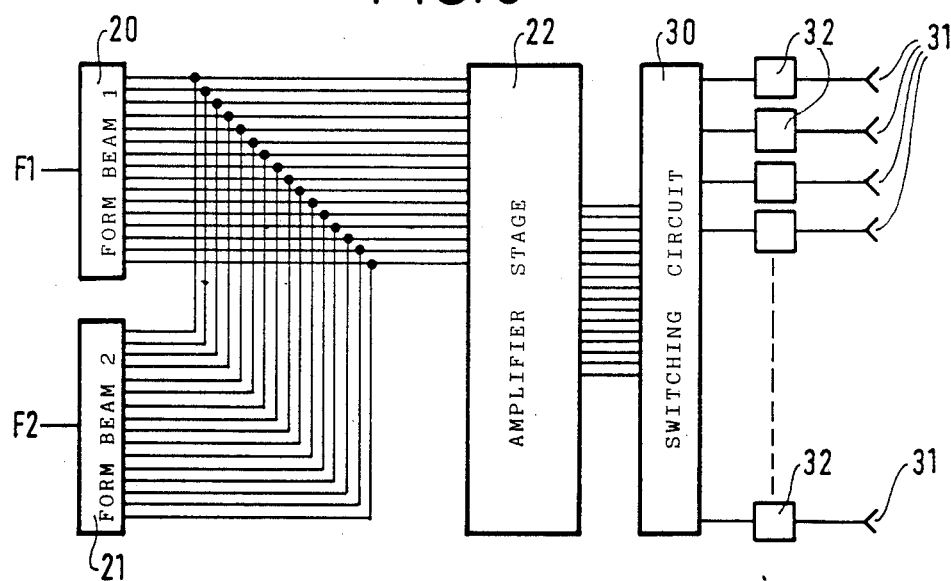
FIGS. 3 and 4 show one embodiment of control electronics for the antenna of the invention.

The configuration shown in FIG. 1 comprises a reflector and an array for generating a beam having quasi-constant gain in any direction over a wide field of transmission. The feed and control electronics for such an antenna is shown in FIG. 3.

In this figure, two beam-forming circuits 20 and 21 synthesize two beams.

In this case, each of the circuits 20 and 21 have 16 outputs, with the relative amplitude and phase of the signals leaving these circuits being controlled by sets of 16 adjustable phase shifters and 16 adjustable attenuators contained in each of the circuits 20 and 21.

The 2×16 outputs from these circuits are connected in pairs to the 16 inputs to amplifier stage 22 via 16 combiners which are not shown in the figure.

In amplifier stage 22, a signal applied to its first input, for example, reappears on its first output in amplified form.

Figure 4:
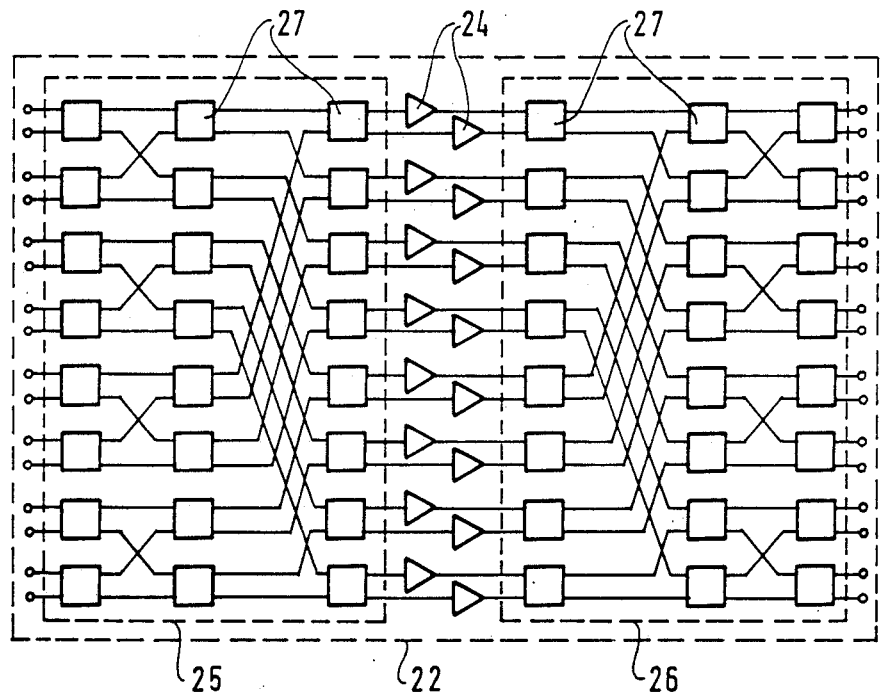

The amplification stage 22 is shown in greater detail in the circuit diagram of FIG. 4.

Each of the power amplifiers 24 receives a signal coming from each of the beams on its respective input, with said signals being substantially identical in level.

In accordance with the invention, it is possible to use a single generalized coupler 26 connected to the outputs of the amplifiers 24.

However, it is advantageous to interpose first and second generalized couplers 25 and 26 formed by respective associations of hybrid couplers 27 on either side of the amplifiers 24 in such a manner that each input of the first coupler is spread over all of the amplifiers and thus over all of the outputs from the hybrid couplers 27 of the first generalized coupler 25.

This gives rise to a quasi-uniform load distribution over all of the inputs to the amplifiers 24. The signals are then reconstituted by means of the second generalized coupler 26 whose structure is the inverse of the structure of the first coupler, thereby reconstituting levels corresponding to each of the beams, i.e. in this case to the two beams F1 and F2.

This embodiment optimizes the operation of the amplifier stage.

Each amplifier is fed with components coming from each of the two beams F1 and F2 in such a manner that no change in traffic can have an impact on the level of the input signal applied to any of the amplifiers so long as the total traffic remains constant.

As shown in FIG. 3, a switching circuit 30 (for reconfiguration purposes) connects the 16 outputs of the amplifier stage 22 to n array radiating elements 31 via filters 32.

In order to reconfigure the beams, the amplitude and phase characteristics applied to the radiating elements are modified, as are the positions of the radiating elements.

These characteristics of amplitude and phase are adjusted by means of variable attenuators and variable phase shifters contained in the beam-forming circuits 20 and 21. The positions of the radiating elements are selected by the switching circuit 30.

In a variant embodiment, variable phase shifters which are not shown in the figures are disposed respectively at the outputs of the beam-forming circuits 20 and 21 and at the outputs of the second generalized coupler 26.

Naturally the present invention has been described and shown purely by way of preferred example and its component parts could be replaced by equivalent parts without thereby going beyond the scope of the invention.

We claim:

1. An antenna which is electronically reconfigurable in transmission, the antenna comprising an array of elementary sources, feed and control electronics, and an energy-focusing reflector, with the array being situated in the focal zone of said reflector, said feed and control electronics comprising:

m beam-forming circuits each including a set of adjustable phase shifters and a set of adjustable attenuators with each beam-forming circuit synthesizing a respective one of m beams;

means for combining outputs from said beam forming circuits to obtain a set of combined signals;

an amplifier stage for receiving and amplifying said combined signals, said amplifier stage comprising amplifiers connected in parallel and followed by a generalized coupler formed by an association of hybrid couplers; and a switching circuit which interconnects the outputs from the amplifier stage to the radiating elements of the array.

2. An antenna according to claim 1, wherein the amplifier stage comprises first and second generalized couplers disposed on either side of the amplifiers, with the second generalized coupler being of a structure which is the inverse of the structure of the first generalized coupler.

3. An antenna according to claim 1, wherein filters are disposed respectively between the outputs of the amplifier stage and the radiating elements of the array.

4. An antenna according to claim 1, wherein each beam-forming circuit provides n outputs, and wherein said means for combining combines corresponding outputs from each beam-forming circuit to obtain n combined signals to be provided to said amplifier stage.

* * * * *